United States Patent [19]
Riley

[11] 3,939,558
[45] Feb. 24, 1976

[54] METHOD OF FORMING AN ELECTRICAL NETWORK PACKAGE

[75] Inventor: Richard E. Riley, Riverside, Calif.

[73] Assignee: Bourns, Inc., Riverside, Calif.

[22] Filed: Feb. 10, 1975

[21] Appl. No.: 548,326

[52] U.S. Cl. .................... 29/627; 29/577; 29/588; 29/589; 174/52 S; 174/52 PE; 156/272; 156/275; 264/272; 317/101 CP
[51] Int. Cl.² ...................... H05K 3/28; H05K 3/10
[58] Field of Search ............ 29/625, 626, 627, 577, 29/588, 589; 174/68.5, 50.5, 50.51, 50.52, 50.54, 50.6, 50.61, 50.62, 50.64, 52 S, 52 R, 52 PE, 52 FP, 59, DIG. 3; 357/72, 74, 75, 80; 317/101 A, 101 B, 101 CP; 156/60, 228, 272, 275, 295, 313, 320; 264/272

[56] References Cited
UNITED STATES PATENTS

| | | | |
|---|---|---|---|
| 3,239,403 | 3/1966 | Williams et al. ................... | 156/275 |
| 3,341,649 | 9/1967 | James ........................... | 264/272 X |
| 3,348,640 | 10/1967 | Thompson et al. ................. | 156/272 |
| 3,648,121 | 3/1972 | Suenaga et al. .................. | 357/72 |
| 3,714,370 | 1/1973 | Nixen et al. .................... | 174/52 S |
| 3,795,047 | 3/1974 | Abolafia et al. ................. | 156/275 X |
| 3,835,531 | 9/1974 | Luttmer ......................... | 317/101 B X |
| 3,871,018 | 3/1975 | Jackson et al. .................. | 174/52 S X |
| 3,872,331 | 3/1975 | Falco ........................... | 317/101 CP X |

Primary Examiner—C. W. Lanham
Assistant Examiner—Dan C. Crane
Attorney, Agent, or Firm—Richard S. Koppel; William G. Becker

[57] ABSTRACT

A method of forming an electrical network package in which a B-stage thermosetting adhesive material is sandwiched between and adheres together a substrate bearing a network of electric circuit elements, and a protective superstrate. The component package is first heated sufficiently to initiate the formation of the adhesive into a gel. The package may then be cooled, and is momentarily compressed in order to flow the adhesive material into sealing relation with the electric network and to inhibit relative slippage between the substrate and superstrate followed by further heating to fully cure the adhesive.

Except for the momentary compression, the entire curing sequence is performed without the application of external pressures, thereby considerably simplifying the requisite machinery. The method is adaptable to mass production techniques by employing a single continuous adhesive tape and lead frame in connection with a multiplicity of substrates.

8 Claims, 3 Drawing Figures

METHOD OF FORMING AN ELECTRICAL NETWORK PACKAGE

BACKGROUND OF THE INVENTION

This invention relates to methods of forming electrical components, and more particularly to a method of forming a package having a sealed network of electric circuit elements.

The use of sealed electric network packages has become quite popular for circuit board and similar applications. Such packages are relatively inexpensive, mass produced components that provide numerous alternatives both in the manner in which they can be connected to an external circuit, and in the choice of electrical characterisitcs available. They typically involve a network of circuit elements such as resistors, inductors, or capacitors that are deposited on a substrate and protected from the outside environment by means of a superstrate which is held on by an adhesive. A number of lead wires make electrical connections at various terminal points on the network and extend out from the package to facilitate connection with an external circuit. Selected portions of the sealed network can then be integrated into a circuit board by soldering or otherwise connecting an appropriate combination of lead wires to the board circuit. The packages generally come in one of two configurations: single-in-line (SIP) with a single set of leads protruding from one edge of the package, and double-in-line (DIP) with two sets of lead wires protruding from opposite edges of the package.

While separate clamps could be used to hold the package together, it has generally been found preferable to employ an adhesive to the substrate and superstrate. In addition to producing a smaller package with possible cost savings, adhesives have the advantage of sealing the enclosed network and thereby providing a first barrier against the outer environment. However, the manufacture of network packages with adhesives has not proved to be completely satisfactory, and there are still areas in which further improvements are desirable. For example, the substrate and superstrate have generally been clamped together during all or a substantial portion of the time in which the adhesive is cured. This in turn has lead to a requirement for fairly expensive machine parts such as molds or dies. Such equipment is generally inflexible in the sense that it cannot readily accommodate changes in the dimensions of the network package, necessitating the maintenance of multiple lines of manufacturing apparatus or frequent retooling if a number of different package sizes are produced either concurrently or in succession. Mass production capability may also be limited because each mold or die is occupied for substantially the entire period necessary to cure the adhesive, thereby necessitating the acquisition of additional molds or dies in order to increase the production rate. Care must also be exercised in the design and operation of the equipment to ensure that the substrates and superstrates are not damaged when the package is clamped.

SUMMARY OF THE INVENTION

In view of the above stated problems associated with the prior art, it is an object of the present invention to provide a novel and improved method of manufacturing electric network packages in which the requirement of separate molds or dies for each package or group of packages is eliminated.

Another object of the invention is the provision of a novel and improved method of manufacturing an electric network package that is adaptable to mass production techniques.

A further object is the provision of a novel and improved method of manufacturing an electric network package that can accommodate different package sizes with a single set of manufacturing equipment and without the need for retooling when the package size is changed.

Yet another object of the present invention is the provision of a novel and improved method of manufacturing an electric network package in which the danger of damaging the package components is very low.

In the accomplishment of these and other objects, the method contemplated by the present invention involves the emplacing of a B-stage adhesive material on a substrate onto which a network of electric circuit elements has been deposited, with lead wires connected to the network at various locations and extending outwardly from the substrate. The adhesive is heated in a first heating step to initiate the formation of a gel, which is an early stage in the full curing cycle reached just after the adhesive has softened and wet the surface of the substrate. At this time a superstrate, which may have been positioned on the package prior to the initial heating step, is compressed against the adhesive and substrate to cause the adhesive to flow into a sealing relation with the electric network. The compression is sufficient to partially bond the package together and prevent the superstrate from slipping out of alignment with the substrate. The package is again heated, typically for about an hour, to complete the adhesive cure and securely bond the substrate and superstrate together. If desired the package may be cooled after the initial heating stage, allowing the adhesive gel to partially harden and thereby increase its holding strength prior to final cure.

When the above method is employed it is necessary to apply outside pressure to the package at only one point in the entire manufacturing process, and then only for a very short period of time. This feature makes the method adaptable to mass production techniques since a single compressing station may be used for all of the packages in a manufacturing run, rather than having to provide a multiplicity of separate dies or molds to clamp the packages while the adhesive is cured.

BRIEF DESCRIPTION OF THE DRAWINGS

Further advantages and features of the present invention will be apparent to those skilled in the art from the ensuing detailed description thereof, taken with the accompanying drawings, in which.

DETAILED DESCRIPTION

Figure 1:
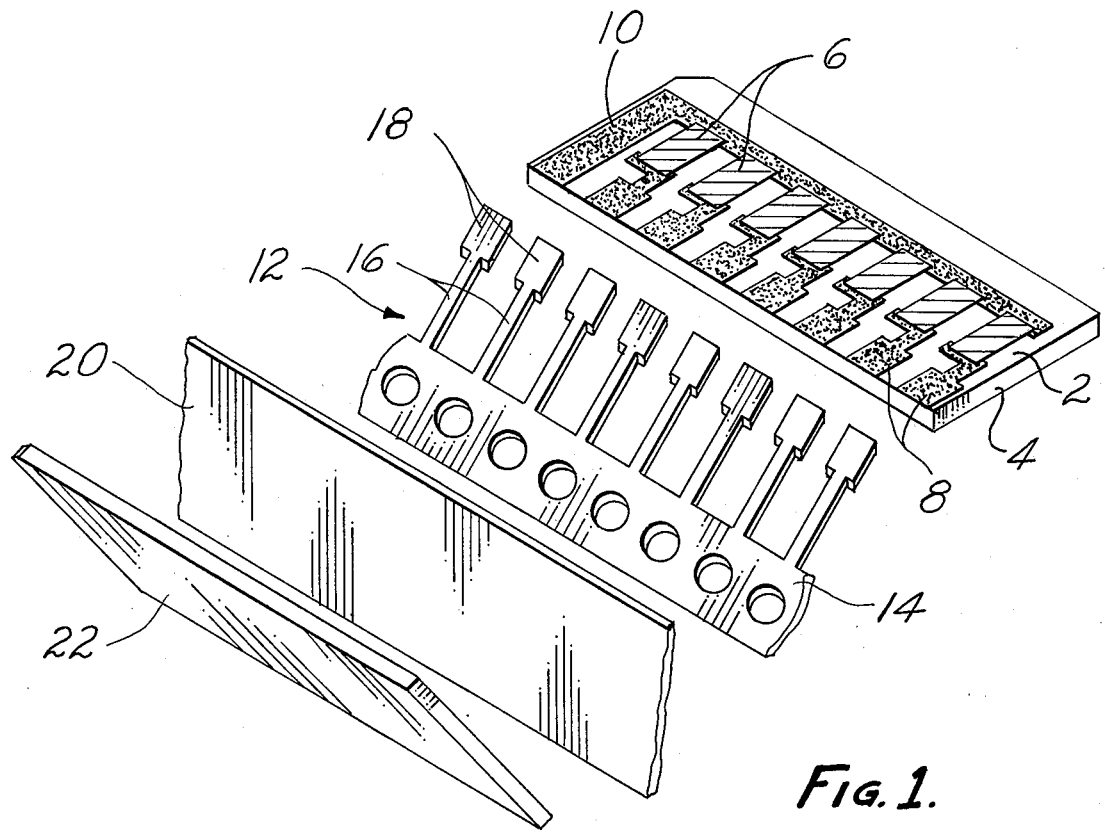
FIG. 1 is an exploded view of the components of a typical network package capable of assembly according to the method of the present invention.

FIG. 1 shows the components of a typical network package that can be manufactured according to the present invention. Deposited onto one face 2 of a flat ceramic substrate 4 is a network of resistance strips 6, each of which is composed of a material such as cermet that has a particular resistance as determined by the electrical design of the package. While only resistance elements are shown, it should be realized that other circuit elements such as inductors or capacitors could also be employed if desired. techniques for depositing these elements on a substrate are well-known and form no part of the present invention, and therefore will not be discussed herein.

A plurality of termination pads 8 are distributed along the edge of upper substrate face 2, one for each of the network elements 6. Pads 8 are formed from any suitable conductive material, each forming an intimate electrical connection with its associated resistance element 6 so as to provide a base for the connection of lead wires. A common termination strip 10 extends adjacent to the opposite edge of the substrate face 2 from termination pads 8 and is electrically connected to each of the resistance elements 6 such that substantially the full resistance value of each element 6 is contained between its associated termination pad 8 and common strip 10. Strip 10 makes a right angle turn at one end of the substrate 4 so as to present an additional termination surface in alignment with the array of termination pads 8.

The particular configuration of resistive elements shown is intended for illustrative purposes only, rather than in any limiting sense. It should be apparent that many other configurations could be used, with or without a common strip.

In order to connect the aforementioned electrical network with a circuit board, a lead frame 12 which includes a connecting bar 14 from which a plurality of flat lead wires 16 extend is employed. Each lead wire 16 includes at its end opposite to connecting bar 14 a flat, slightly enlarged portion 18 having an area comparable to that of termination pads 8. The spacing between lead wires 16 is equal to the spacing between resistance element 6, whereby the enlarged lead wire portions 18 may be aligned with and connected to termination pads 8 by soldering or the like to form intimate electrical connections therewith. Connecting bar 14 serves only to hold lead wires 16 together for convenience during the manufacturing process, and is cut away at an appropriate time after the lead frame is in place. Lead frame 12 is typically provided in the form of a long continuous strip having hundreds of lead wires 16. As will be seen hereinafter, such lead frames can be advantageously adapted to mass production techniques with the present invention.

After lead frame 12 is attached, a layer of adhesive material 20 is emplaced over substrate face 2 and its associated electric network. Adhesive 20 is a B-stage thermosetting material, i.e., it has already been partially cured before being applied to the network package. One adhesive that has been found to perform satisfactorily in the manufacture of network package is "SCOTCH-WELD" brand structural adhesive AF-111, produced by the 3M Company. B-state adhesives exhibit particular qualities that have been employed in the present invention to greatly reduce the tooling necessary in the manufacture of network packages. Specifically, as the adhesive is heated to the temperature prescribed for curing it softens and wets the surface to which it has been applied. As heating continues the formation of a low strength gel is initiated; continued curing chemically converts the gel into a high strength, solvent resistant bond.

According to the adhesive manufacturer's recommendations, pressure should be applied to the adhered parts during all or a substantial portion of the cure in order to keep the parts in alignment and to overcome distortion and thermal expansion in the adherends. With the present invention, however, pressure is applied during only a very short portion of the cure, when the adhesive is initially formed into a low strength gel. This technique has been found to satisfactorily hold the package together when the adhesive is subsequently fully cured, thereby eliminating the need for individual dies or molds to clamp the packages.

Continuing with the description of the component parts of the network package, a ceramic superstrate 22 which is preferably identical to substrate 4 is aligned over the substrate, sandwiching adhesive layer 20 in between. With superstrate 22 in place, the package is subjected to a first heating step in which it is heated to a curing temperature, preferably about 125°C for the aforementioned AF-111 material. When the adhesive has entered the initial stages of the formation of a gel and is capable of providing a low strength bond, pressure is applied to the superstrate 22, either manually or by an automated stamping head. The resulting compression of the package causes adhesive 20 to flow over substantially the entire surface area of substrate face 2, thereby sealing the electrical network carried thereon. It has been found that if the pressure is applied during the initial stages of the gel the adhesive is soft enough to adequately flow, but has enough bonding strength to hold the substrate 4 and superstrate 22 in alignment for the remainder of the curing cycle without the need for any external clamps. Some latitude is permissible in the time at which the pressure must be applied, which will vary with the rate at which the adhesive is heated and the ultimate curing temperature reached. For the AF-111 material, which will fully cure in about 1 hour at a temperature of 125°C, a first heating step of about 5 minutes before applying pressure to the package is generally satisfactory for network packages that are originally at room temperature when entering a kiln. There is also considerable leeway in the amount of pressure that can be applied, the outer limitations being that the pressure must be great enough to cause the adhesive to flow into sealing relation with the network elements and bond the substrate and superstrate together sufficiently to prevent subsequent slippage, but cannot be so great as to squeeze too much adhesive out of the package or damage the ceramic material. In general, pressures of between 10 and 25 psi applied for up to a few seconds are satisfactory, although this pressure range should not be taken as limiting.

In order to increase the adherence between substrate 4 and superstrate 22 and thereby reduce the chance of slippage during the final curing step, the network package may be allowed to cool after undergoing the initial heating step and prior to being compressed. This may be accomplished by the employment of a bifurcated kiln with an open air compression station located between two kiln sections. As the packages emerge from the first section on a conveyer belt or the like they are cooled by the ambient air and then compressed before entering the second kiln section. The adhesive gel hardens somewhat as it is cooled and tends to hold superstrate 22 more firmly in place, but also to flow less easily. Depending upon the degree of cure reached during the first heating step, more or less cooling may be desirable. If the initial heating is permitted to continue for too long before the package is compressed, the adhesive can become so hard that a satisfactory joinder will not be achieved.

During the second heating or full cure step the package is heated to any convenient temperature that will effect a satisfactory cure, so long as the temperature is not high enough to substantially alter the electrical characteristics of the network elements. After full cure is achieved the network packages are cooled and cleaned, such as by blasting with an aluminum oxide mixture to remove scuffs and adhesive that has flowed out from between the substrate 4 and superstrate 22.

Figure 2:
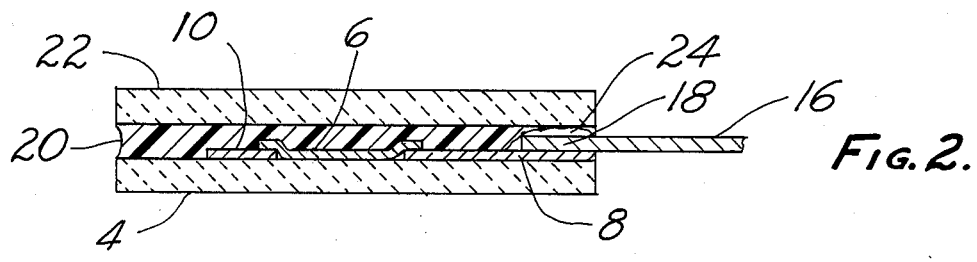
FIG. 2 is a cross-sectional view of an assembled network package.

Referring now to FIG. 2, a completed SIP package is shown with a substrate 4 and superstrate 22 firmly held in place by a fully cured layer of adhesive 20 that has flowed over substantially the entire upper surface area of substrate 4 to seal network elements 6. Adhesive 20 also serves to strengthen the physical bond between lead wires 16 and termination pads 8 initially established by solder deposits 24. While lead wires 16 are shown as extending outwardly from the right hand side of the package, it should be realized that the present method is equally applicable to the formation of a DIP package, in which lead wires would also extend out from the opposite side of the package. DIP packages will generally require a different configuration of network elements than that shown in the figures, but the method of cementing the packages together would be the same as for a SIP package.

Figure 3:
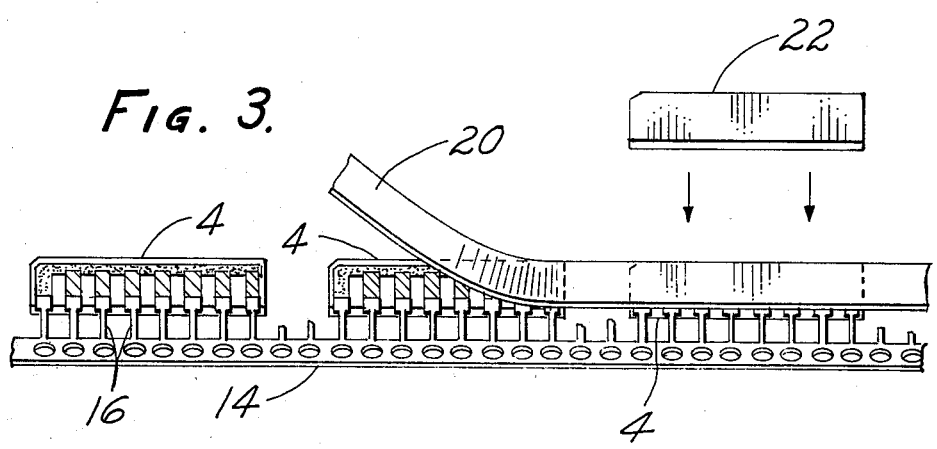
FIG. 3 is a somewhat idealized representation of a method of mass production facilitated by the present invention.

A representation of a mass production technique employing the method of the present invention is shown in FIG. 3. A plurality of substrates 4, onto which appropriate resistance elements and termination facilities have been deposited, are arranged in an end-to-end linear array. Lead wires 16 carried by a continuous lead frame 12 are soldered onto the termination pads of each substrate 4, preferably by means of an automated soldering apparatus, such that substrates 4 are joined together by lead frame 16. The substrate array is moved by means of a conveyor belt or the like to a station at which a continuous tape of B-stage adhesive material is emplaced on the upper substrate surfaces by appropriate means such as a roller dispenser. Superstrates 22 are then positioned on tape 20 in alignment with underlying substrates 4 by means of an automatic feeding mechanism, not shown. The network package components are then moved into a kiln where the initial heating step is performed and the adhesive material transformed into a soft gel state. At this point, following any cooling that may be desired, a stamping head is lowered to compress the package by the amount required to flow the adhesive over substrates 4 and bond substrates 4 and superstrates 22 together sufficiently to prevent relative slippage therebetween. The network packages are then forwarded to another section of the kiln to be fully cured, followed by a severing of the unused portions of adhesive tape 20 and lead frame 12 between the separate packages. Suitable machinery for performing this mass production operation has not been shown since numerous types of mechanisms may occur to one skilled in the art of machinery design, and the present invention is directed toward the sequence of steps necessary to form network packages, rather than on particular machinery that may be used to carry out each step of the sequence.

While particular components and operating ranges have been shown and described above, numerous variations and modifications are possible within the scope of the invention without sacrificing the advantages of eliminating separate molds or dies and being able to accommodate different network package sizes without extensive retooling. With respect to the latter feature, it can be seen that a change in the package size can be accommodated by merely changing the dimensions of lead frame 12 and adhesive tape 20, and perhaps by also modifying any automatic insertion machinery that may have been employed with respect to substrates 4 and superstrates 22. A single conveyor belt for carrying the packages through the production sequence can be made wide enough to accommodate any expected dimensions, while the compression device may comprise a single pressure head that is large enough to extend over the full range of expected package sizes. Therefore, it is intended that the scope of the invention be limited only in and by the terms of the appended claims.

What is claimed is:

1. The method of joining a substrate with a superstrate to form an electrical network package, said substrate bearing a network of electric circuit elements on one face, comprising the sequential steps of:
    sandwiching a B-stage thermosetting adhesive material between said superstrate and the circuit-bearing face of said substrate,
    heating the resulting sandwiched package sufficiently to initiate the formation of said B-stage material into a gel,
    compressing said substrate and superstrate together sufficiently to cause said adhesive material to flow into sealing relation with said electric network,
    releasing said compression, and
    heating the resulting network package to substantially cure said adhesive material subsequent to releasing of said compression.

2. The method of claim 1, wherein the step of heating the sandwiched package sufficiently to initiate the formation of the B-stage material into a gel is performed while the package is substantially free of external compressive forces.

3. The method of claim 1, and further including the step of cooling the network package subsequent to initiating the formation of said adhesive material into a gel but prior to said compressing step, thereby at least partially hardening said gel.

4. The method of joining a substrate with a superstrate, said substrate bearing a network of electric circuit elements on one face, to form a package in which the network is substantially sealed, comprising the sequential steps of:
    emplacing a B-stage thermosetting adhesive material on said substrate face,
    heating said substrate and adhesive material sufficiently to initiate the formation of said adhesive material into a gel at a temperature less than the temperature necessary to substantially alter the electrical characteristics of said circuit elements,
    momentarily compressing said adhesive material between said substrate and a superstrate sufficiently to flow said adhesive material into sealing relation with electric circuit elements and inhibit relative slippage between said substrate and superstrate,
    releasing said compression, and heating the resulting package to substantially cure said adhesive material subsequent to releasing of said compression.

5. The method of forming an electrical network package, comprising the sequential steps of:
depositing a network of electric circuit elements on a face of a substrate,
connecting electrical termination means to said network with the termination means extending outwardly from the substrate,
positioning a B-stage thermosetting adhesive material on said substrate face,
positioning a superstrate on said adhesive material,
heating said adhesive material sufficiently to initiate the formation of said adhesive material into a gel,
compressing said substrate and superstrate together against said adhesive material sufficiently to inhibit relative slippage therebetween,
releasing said compression, and
heating the resulting network package to substantially cure said adhesive material subsequent to releasing of said compression.

6. The method of claim 5, and further including the step of cooling said adhesive material after the initiation therein of a gel formation but prior to said compressing step, thereby at least partially hardening said adhesive material.

7. The method of claim 5, wherein said adhesive material is provided in the form of a tape.

8. The method of forming each of a plurality of electrical network packages according to the method of claim 5, including the steps of depositing a network of electric circuit elements onto a face of each of a plurality of substrates, arranging said substrates in a linear array, connecting a continuous termination lead frame to the electric networks of said linearly arrayed substrates, and emplacing a continuous tape of B-stage thermosetting adhesive material on the substrates in said array, and further including the additional step of severing said tape and termination lead frame between each of said substrates after forming the network packages, thereby providing a plurality of discrete packages.

* * * * *